United States Patent
Onuma et al.

(10) Patent No.: US 9,075,083 B2
(45) Date of Patent: Jul. 7, 2015

(54) PROBE CARD

(71) Applicant: KABUSHIKI KAISHA NIHON MICRONICS, Tokyo (JP)

(72) Inventors: Yoshihito Onuma, Tokyo (JP); Yoshihito Kitabatake, Tokyo (JP); Ken Hasegawa, Tokyo (JP); Takayuki Kogawa, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 99 days.

(21) Appl. No.: 13/896,705

(22) Filed: May 17, 2013

(65) Prior Publication Data

US 2013/0328585 A1  Dec. 12, 2013

(30) Foreign Application Priority Data

May 29, 2012  (JP) .................... 2012-122381

(51) Int. Cl.
*G01R 31/00* (2006.01)
*G01R 1/04* (2006.01)
*G01R 1/073* (2006.01)

(52) U.S. Cl.
CPC .......... *G01R 1/0408* (2013.01); *G01R 1/07314* (2013.01)

(58) Field of Classification Search
CPC ........................ G01R 1/0408; G01R 31/026
USPC .................. 324/756.03–757.04, 500, 763.01, 324/437–446, 754.01, 754.03
See application file for complete search history.

(56) References Cited

U.S. PATENT DOCUMENTS 6,496,001 B1 * 12/2002 Barringer et al. ........ 324/750.25

FOREIGN PATENT DOCUMENTS

| JP | 04-297879 | 10/1992 |
|----|-----------|---------|
| JP | 2000-150596 | 5/2000 |
| JP | 2006-3191 | 1/2006 |
| KR | 10-2006/0046627 | 5/2006 |

OTHER PUBLICATIONS

First Office Dated Aug. 28, 2014 Issued in Corresponding Korea Patent Application No. 10-2013-0045240.

* cited by examiner

*Primary Examiner* — Melissa Koval
*Assistant Examiner* — Trung Nguyen
(74) *Attorney, Agent, or Firm* — Bacon & Thomas, PLLC

(57) ABSTRACT

An electrode and wiring can be provided on an FPC board without restriction by a through hole. A probe card in which an FPC board of a probe assembly is fixed to the main board side by a clamp mechanism is provided. The clamp mechanism is provided with a fixing ring fixed to the main board side and on which the FPC board is mounted and a rotating ring screwed into the fixing ring and pressing a peripheral edge portion of the FPC board. In the fixing ring, a pressing ring pressed by screwing of the rotating ring for pressing the peripheral edge portion of the FPC board to the main board side is provided.

5 Claims, 7 Drawing Sheets

PROBE CARD

CROSS-REFERENCE TO RELATED APPLICATION

This application claims, under 35 USC 119, priority of Japanese Application No. 2012-122381 filed on May 29, 2012.

BACK GROUND OF THE INVENTION

1. Technical Field Relating to the Invention

The present invention relates to a probe card in which a flexible printed circuit (FPC) board is mounted on a main board by a clamp mechanism.

2. Background Art

Probe cards used for inspection of a semiconductor wafer and the like are generally known. This probe card is mainly provided with a main board, an FPC board, a fixed plate and the like. The main board and the FPC board are electrically connected by being fastened using a screw. Specifically, in a state where a plurality of electrodes on a peripheral edge of the FPC board and a plurality of electrodes on the fixed plate side corresponding to them are aligned, they are fastened by a screw and brought into pressure contact so that the main board and the FPC board are electrically connected to each other.

At this time, in order to fasten the main board and the FPC board and to bring them into pressure contact, a through hole through which a screw is inserted is provided in the FPC board.

A plurality of electrodes are provided at a center part of the FPC board, and a probe is electrically connected to each electrode. Then, each probe is brought into contact with an electrode of a semiconductor wafer or the like.

Examples of such probe card include that described in Patent Document 1 (Japanese Patent Laid-Open No. 2006-3191).

SUMMARY OF INVENTION

However, in the above-described prior-art technology, a through hole through which a screw is to be inserted needs to be provided in the FPC board. If a through hole is provided, wiring cannot be provided on a portion of this through hole and thus, a wiring pattern is restricted. Moreover, if a position of an electrode is restricted by the restriction on the wiring pattern, there is a problem that a corresponding electrode on the main board side is also restricted.

The present invention was made in view of the above-described problem and has an object to provide a probe card which solves the restriction on the wiring pattern of the FPC board.

In a probe card in which an FPC board of a probe assembly is fixed to the main board side by a clamp mechanism, a probe card according to the present invention is characterized in that the clamp mechanism is composed of a fixing ring fixed to the main board side and on which the FPC board is mounted and a rotating ring screwed into the fixing ring and pressing a peripheral edge portion of the FPC board.

It is no longer necessary to provide a through hole in the FPC board, there is no longer any wiring prohibited area, and wiring and an electrode can be provided without restriction of the through hole.

DETAILED DESCRIPTION OF THE PREFERRED EMBODIMENTS

Figure 1:
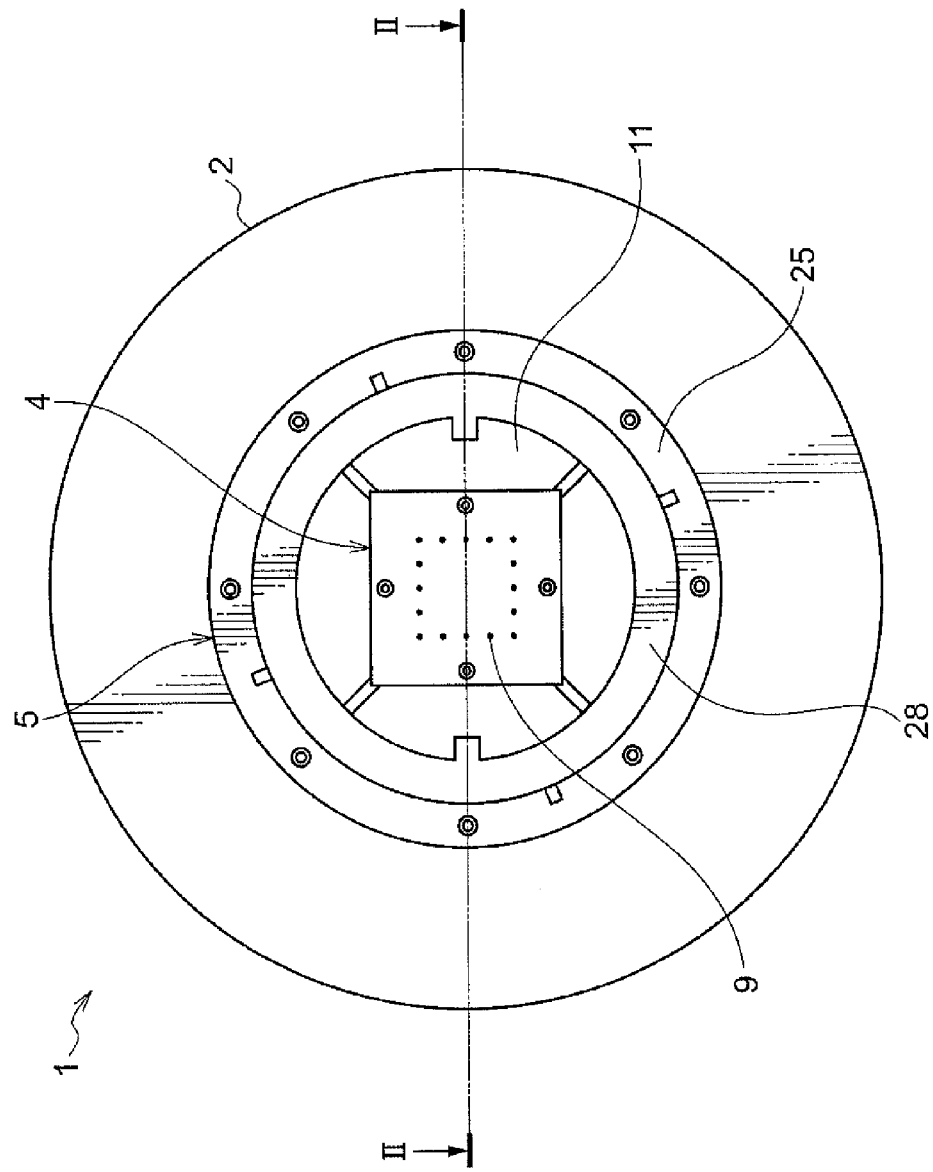
FIG. 1 is a bottom view showing a probe card according to an embodiment of the present invention.
Figure 3:
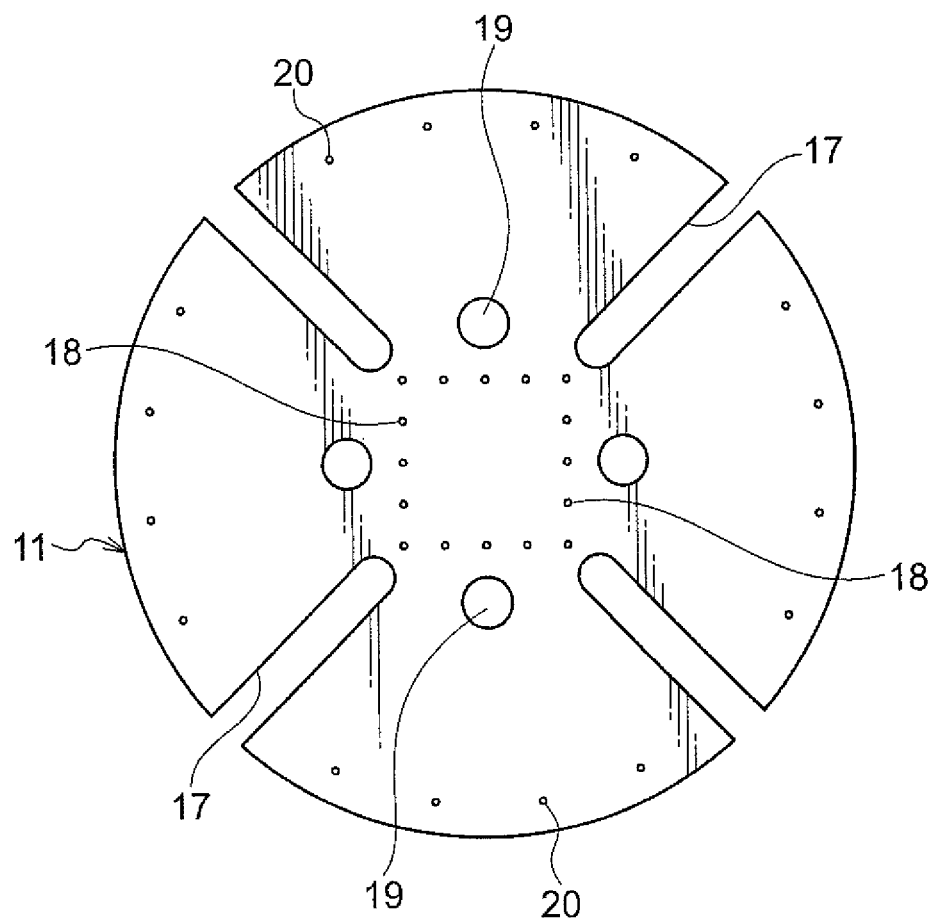
FIG. 3 is a plan view showing an FPC board according to an embodiment of the present invention.
Figure 4:
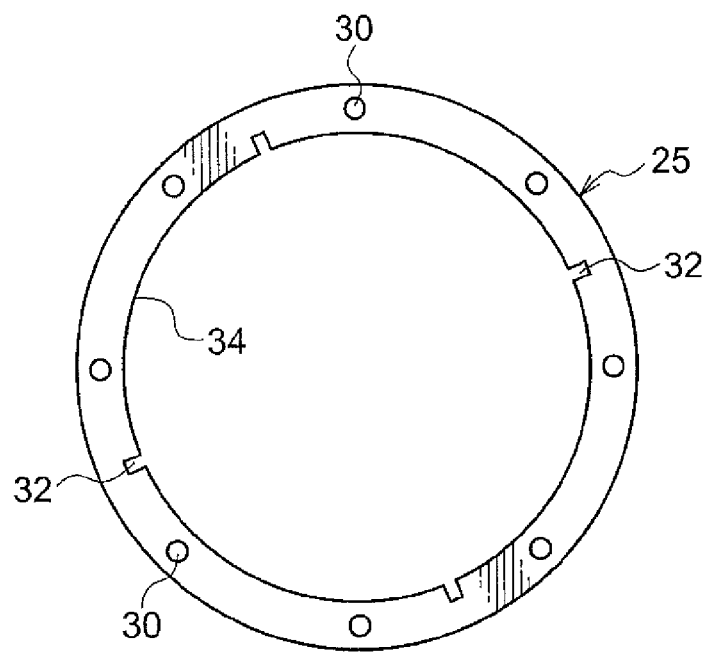
FIG. 4 is a plan view showing a fixing ring according to an embodiment of the present invention.
Figure 5:
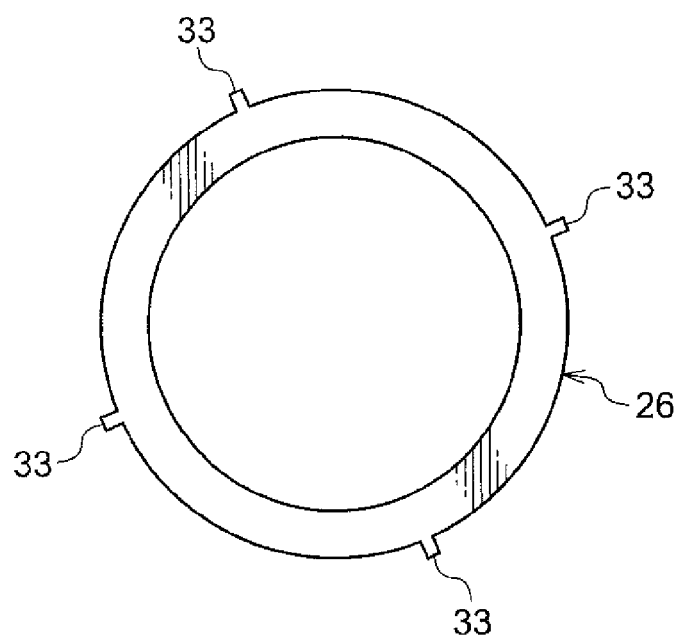
FIG. 5 is a plan view showing a pressing ring according to an embodiment of the present invention.
Figure 6:
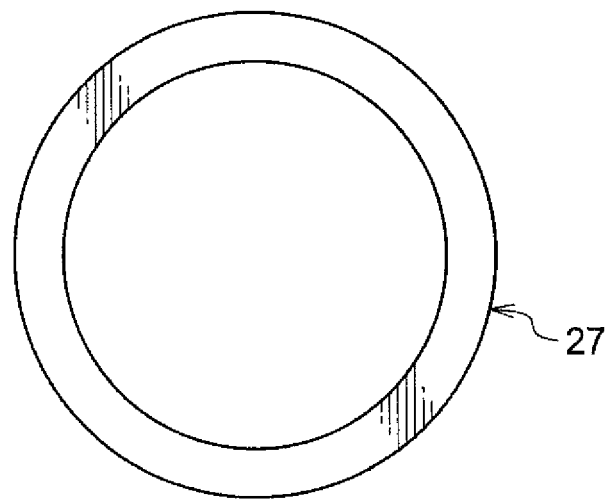
FIG. 6 is a plan view showing an elastic ring according to an embodiment of the present invention.
Figure 7:
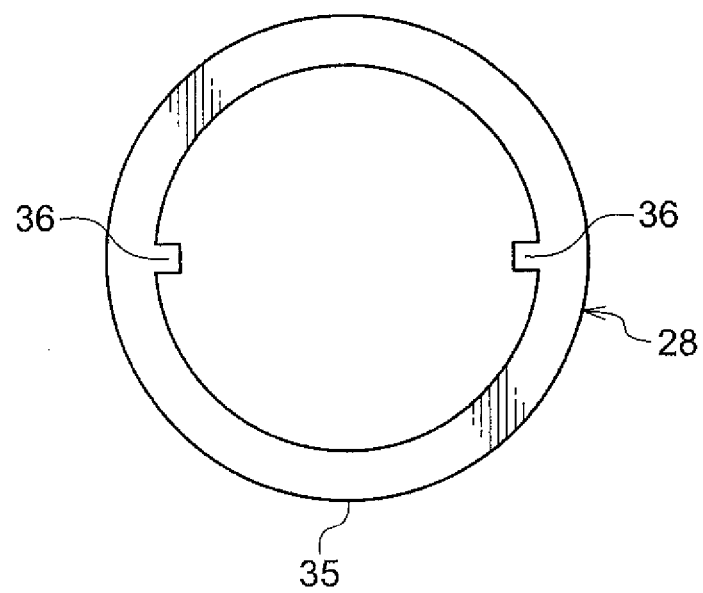
FIG. 7 is a plan view showing a rotating ring according to an embodiment of the present invention.
Figure 8:
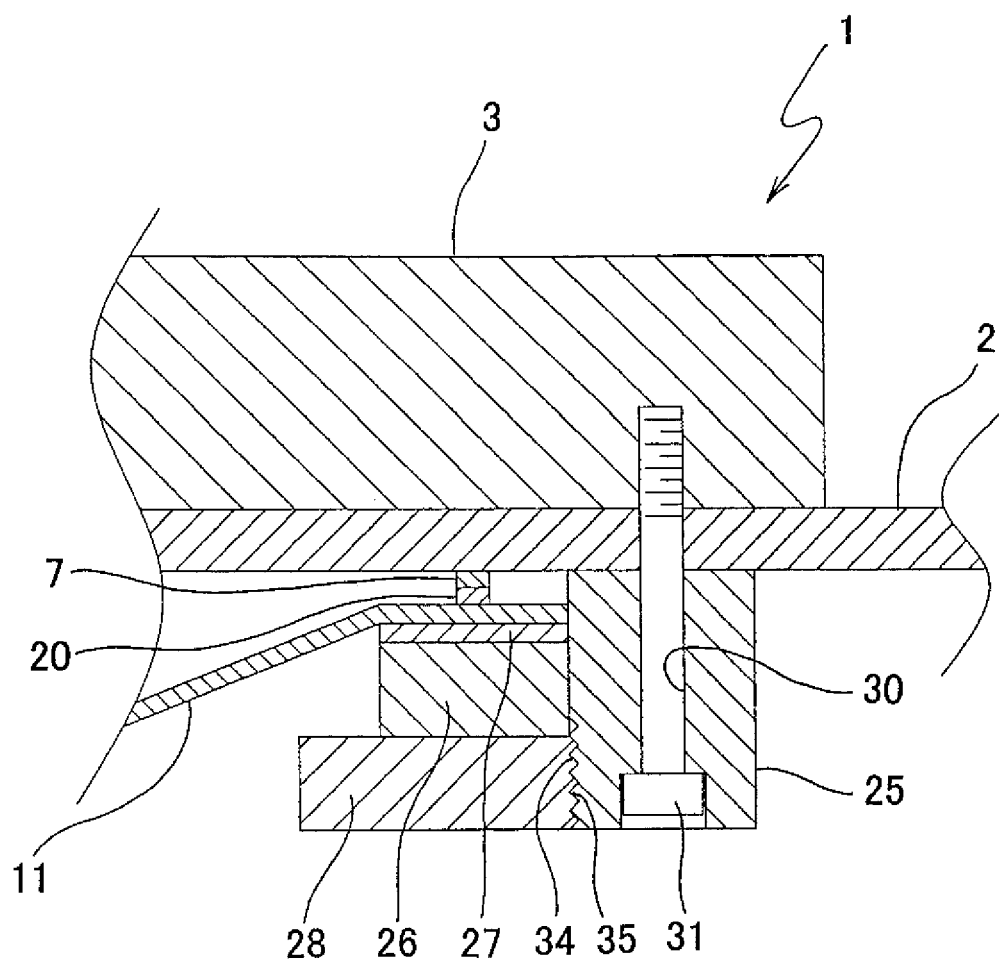
FIG. 8 is a sectional view showing an essential part of the probe card according to an embodiment of the present invention.

A probe card according to an embodiment of the present invention will be described below by referring to the attached drawings. FIG. 1 is a bottom view showing a probe card according to this embodiment, FIG. 2 is a front sectional view showing the probe card according to this embodiment, FIG. 3 is a plan view showing an FPC board, FIG. 4 is a plan view showing a fixing ring, FIG. 5 is a plan view showing a pressing ring, FIG. 6 is a plan view showing an elastic ring, FIG. 7 is a plan view showing a rotating ring, and FIG. 8 is a sectional view showing an essential part of the probe card.

Figure 2:
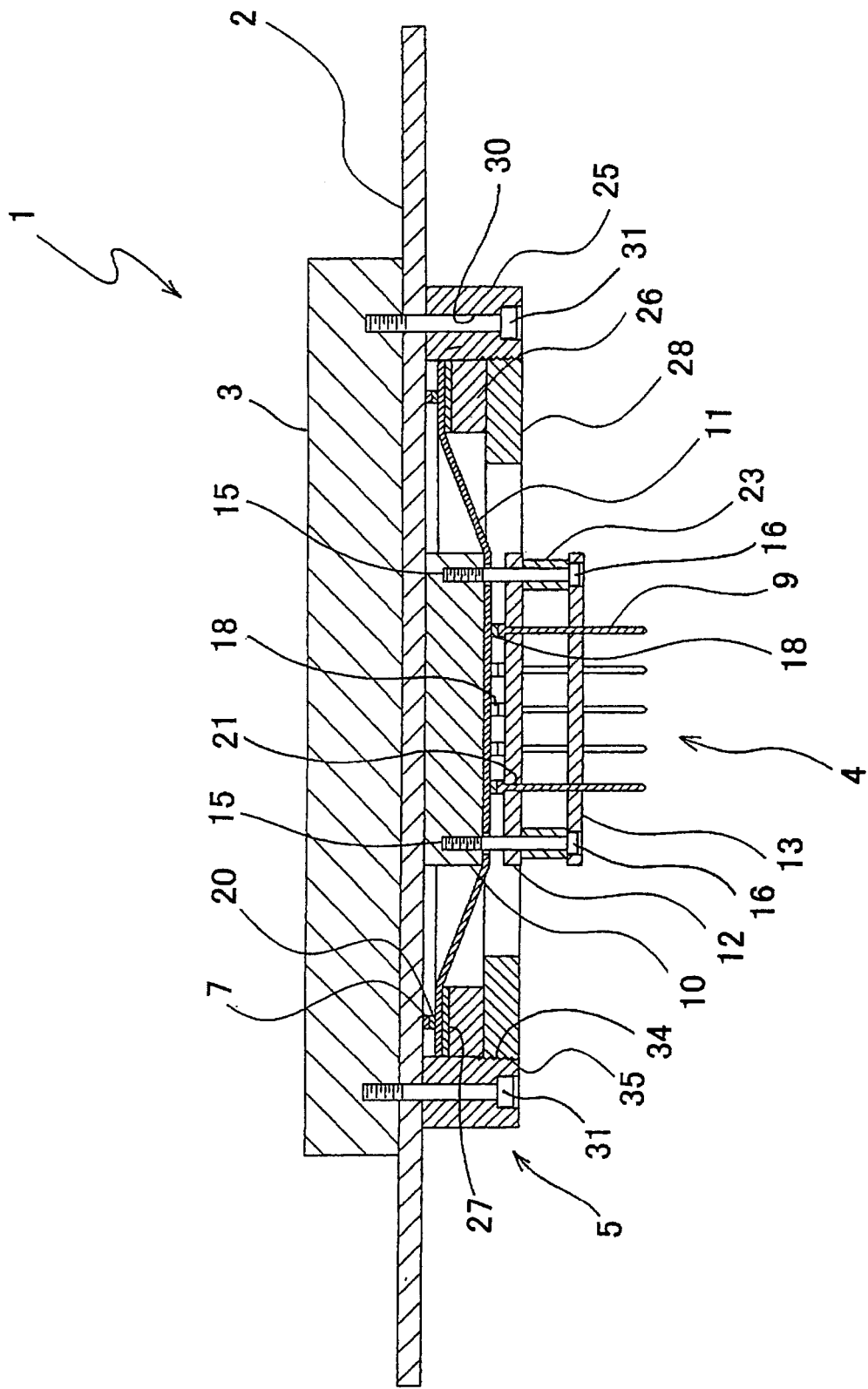
FIG. 2 is a sectional view along an arrow of II-II line in FIG. 1.

A probe card 1 of this embodiment is, as shown in FIGS. 1 and 2, composed of a main board 2, a reinforcing plate 3, a probe assembly 4, and a clamp mechanism 5.

The main board 2 is a member for supporting the probe assembly 4 and for electrically connecting this probe assembly 4 side and a tester (not shown) side to each other. The main board 2 is mounted on the device body side (not shown) while supporting the probe assembly 4. Various circuits and the like are provided on the main board 2, and a plurality of electrodes 7 to be electrically connected to the probe assembly 4 side are provided on the lower side surface thereof. The main board 2 is formed having a disk shape.

The reinforcing plate 3 is a member for reinforcing the main board 2. The reinforcing plate 3 is integrally mounted on the upper side of the main board 2.

The probe assembly 4 is a member for conducting inspection and the like in electric contact with an electrode such as an electronic device or the like to be inspected. The probe assembly 4 is composed of a probe 9, a top plate 10, an FPC board 11, an intermediate plate 12, and a bottom plate 13.

The probe 9 is composed of a rod-shaped member capable of elastic deflection. Each probe 9 has its distal end portion (lower end portion) in contact with an electrode such as an electronic device and carries out application of an electric signal or the like.

The top plate 10 is a member which becomes a base for mounting the probe assembly 4 on the main board 2 side. The top plate 10 is formed having a thick plate shape and mounted on the lower side surface of the main board 2. Screw holes 15 are provided at four positions on the lower side surface of the Lop plate 10. Into these screw holes 15, fixing bolts 16 for fixing the intermediate plate 12 and the like are screwed.

The FPC board 11 is a member for electrically connecting the main board 2 side and each probe 9. The FPC board 11 is, as shown in FIG. 3, formed having a thin disk shape made of a flexible material (polyethylene terephthalate (PET), polyethylene naphthalate (PEN) and the like). In the FPC board 11, slits 17 are provided at four positions. By means of each slit 17, the FPC board 11 can deflect due to a step between the top plate 10 and the main board 2. On the lower side surface at the center of the FPC board 11, a plurality of probe-side electrodes 18 to be electrically connected to each of the probes 9 are disposed by being aligned in the shape of a square. Outside of these probe-side electrodes 18, through holes 19 through which the fixing bolts 16 for fixing the intermediate plate 12 and the like are inserted are provided in the top plate 10 at four spots. On the upper side surface of the peripheral edge portion of the FPC board 11, board-side electrodes 20 corresponding to the probe-side electrodes 18 are provided. Each of the board-side electrodes 20 is disposed at equal intervals on the upper side surface of the peripheral edge portion of the FPC board 11. Wiring is provided between each of the probe-side electrodes 18 and the board-side electrodes 20 and they are electrically connected to each other on the one-to-one basis.

The intermediate plate 12 is a member for supporting the base end (upper end) of each of the probes 9. In the intermediate plate 12, as shown in FIG. 2, a through hole 21 is provided at a position corresponding to the probe-side electrode 18 of the FPC board 11. In a state where the probe 9 is supported by being inserted into each of the through holes 21, the base end portion of each of the probes 9 is brought into contact with and electrically connected with the corresponding probe-side electrode 18 of the FPC board 11.

The bottom plate 13 is a member for supporting an intermediate position of each of the probes 9. Each of the probes 9 supported by the intermediate plate 12 on the base end portion is supported by the bottom plate 13 at the intermediate position thereof and accurately positioned. The bottom plate 13 is fixed integrally to the intermediate plate 12 and the top plate 10 by the fixing bolt 16 through a spacer 23.

The clamp mechanism 5 is a mechanism for fixing the FPC board 11 of the probe assembly 4 to the main board 2 side. The clamp mechanism 5 is composed of a fixing ring 25, a pressing ring 26, an elastic body ring 27, and a rotating ring 28.

The fixing ring 25 is a ring for supporting the pressing ring 26 and the like. In the fixing ring 25, as shown in FIGS. 1, 2, and 4, a plurality of bolt holes 30 are provided. A fixing bolt 31 is inserted into each of the bolt holes 30, respectively. Each of the fixing bolts 31 penetrates the fixing ring 25 and the main board 2 and is screwed into the reinforcing plate 3. As a result, the fixing ring 25 is fixed to the main board 2 side. A fitting recess portion 32 is provided in an inner side of the fixing ring 25. This fitting recess portion 32 is a recess portion in which a fitting projecting portion 33 of the pressing ring 26 which will be described later is fitted so as to suppress rotation of this pressing ring 26 and to allow movement in a vertical direction (vertical direction in FIG. 2) which is a direction of pressing the FPC board 11. The fitting recess portion 32 is composed by a groove chipped in the vertical direction. Moreover, a screw groove 34 is chipped in the inner side surface of the fixing ring 25. A thread 35 of the rotating ring 28 which will be described later is screwed in this screw groove 34.

The pressing ring 26 is a ring for pressing the FPC board 11 to the main board 2 side. An outer diameter of the pressing ring 26 is set to a dimension substantially equal to an inner diameter of the fixing ring 25 as shown in FIGS. 2 and 5. As a result, the pressing ring 26 is fitted in the fixing ring 25 without rattling. An inner diameter of the pressing ring 26 is set to a dimension capable of covering the board-side electrode 20 of the FPC board 11. On the outside of the pressing ring 26, four fitting projecting portions 33 to be fitted in the fitting recess portions 32 in the inside of the fixing ring 25 are provided. The fitting projecting portion 33 is composed of a projecting rim chipped in the vertical direction in accordance with the fitting recess portion 32 on the inside of the fixing ring 25.

The elastic body ring 27 is a ring to be interposed between the pressing ring 26 and the FPC board 11 as a buffer material when the FPC board 11 is pressed by the pressing ring 26. An outer diameter and an inner diameter of the elastic body ring 27 is set equal to the dimension of the pressing ring 26 as shown in FIGS. 2 and 6.

The rotating ring 28 is a ring for pressing the pressing ring 26. An outer diameter of the rotating ring 28 is set to a dimension substantially equal to the inner diameter of the fixing ring 25 as shown in FIGS. 1, 2, and 7. The thread 35 is provided on the outer side surface of the rotating ring 28. By screwing this thread 35 in the screw groove 34 of the fixing ring 25, the rotating ring 28 presses the pressing ring 26. Handles 36 for rotating the rotating ring 28 are provided at two spots on the inside of the rotating ring 28.

With this clamp mechanism 5, as shown in FIGS. 2 and 8, the fixing ring 25 is fixed integrally with the main board 2 and the reinforcing plate 3 by the plurality of fixing bolts 31 in a state where the probe card 1 is reversed. Then, in a state where the FPC board 11 is mounted in the fixing ring 25 and covers the top plate 10, each of the board-side electrodes 20 on the peripheral edge portion of the FPC board 11 is aligned with each of the electrodes 7 of the main board 2. Then, the elastic body ring 27 is mounted in the fixing ring 25, and each of the board-side electrodes 20 on the peripheral edge portion of the FPC board 11 is covered. Then, the pressing ring 26 is mounted in the fixing ring 25, and the elastic body ring 27 is covered. Then, the rotating ring 28 is screwed in the fixing ring 25, and the rotating ring 28 presses the pressing ring 26. As a result, the pressing ring 26 presses the peripheral edge portion of the FPC board 11 in a state where the fitting projecting portion 33 thereof is fitted in the fitting recess portion 32 of the fixing ring 25 and rotation thereof is suppressed; As a result, the clamp mechanism 5 fixes the FPC board 11 of the probe assembly 4 in a state electrically connected to the main board 2 side.

The probe card 1 configured as above is incorporated in a testing device (not shown), each of the probes 9 is brought into contact with each electrode such as an electronic device or the like and an inspection signal is applied.

As described above, in the probe card 1 of this embodiment, since the peripheral edge portion of the FPC board 11 is fixed by the clamp mechanism 5, it is no longer necessary to provide a through hole for fixing the FPC board 11 in the peripheral edge portion of the FPC board 11, and there is no longer a wiring prohibited area. As a result, electrodes and wiring can be provided without restriction by a through hole. Accordingly, even if electrodes and wiring are increased and become complicated as the result of higher density, higher definition and the like of electronic devices or the like, the electrode and wiring can be provided reliably since the card is no longer subjected to the restriction by the through hole.

[Variation]

Figure 9:
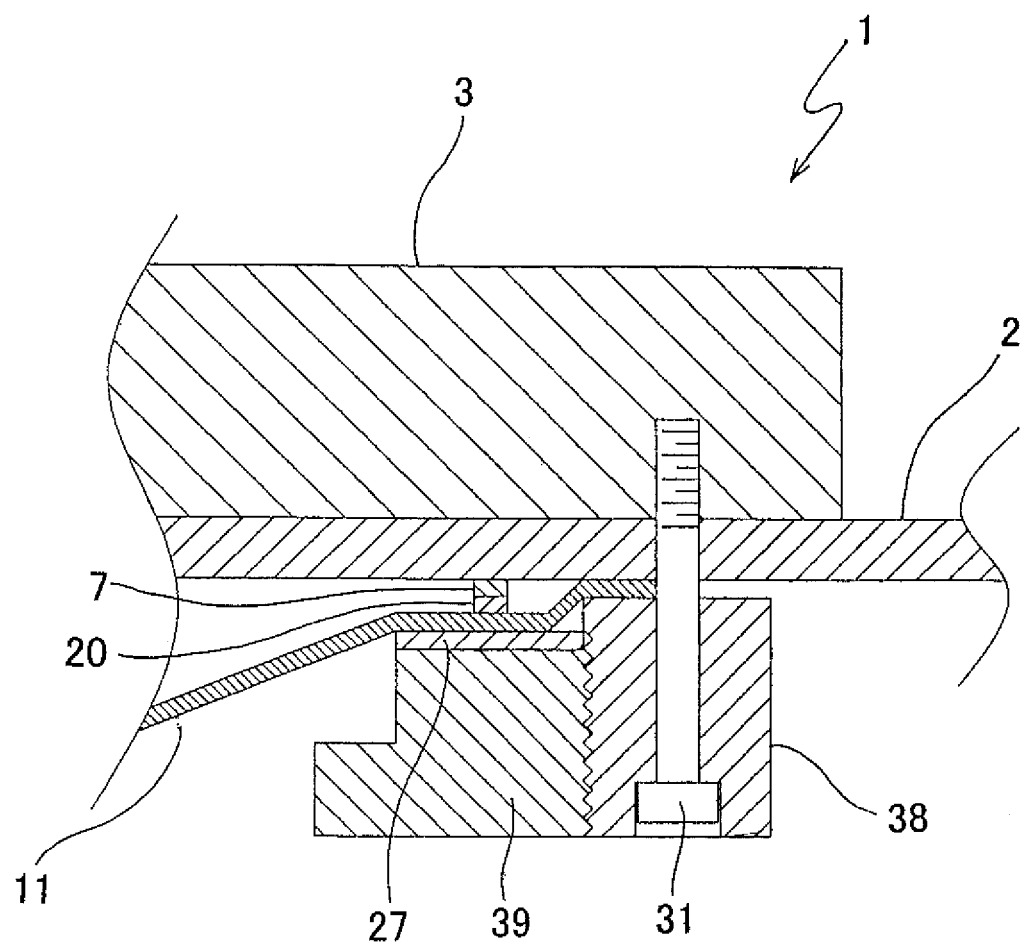
FIG. 9 is a sectional view showing an essential part of the probe card according to a variation of the present invention.

In the above embodiment, the FPC board 11 is mounted in the fixing ring 25, and the peripheral edge portion of the FPC board 11 is fixed by the pressing ring 26 and the like. However, as shown in FIG. 9, the peripheral edge portion of the FPC board 11 may be sandwiched by a fixing ring 38. The fixing ring 38 is substantially similar to the fixing ring 25 of the embodiment, but the height of the fixing ring 38 is smaller than that of the fixing ring 25 of the embodiment only by a portion of the thickness of the FPC board 11. A rotating ring 39 is functionally similar to the rotating ring 28 of the embodiment, but its sectional shape is a shape obtained by integrally combining the rotating ring 28 and the pressing ring 26. The fitting projecting portion 33 is not provided.

By sandwiching the peripheral edge portion of the FPC board 11 by the fixing ring 38 for support, the FPC board 11 can no longer rotate. Thus, the pressing ring 26 is no longer necessary, and the elastic body ring 27 and the rotating ring 39 can serve the function.

As a result, actions and effects similar to those in the above-described embodiment can be exerted and moreover, the number of components can be reduced and thus, a manufacturing cost can be reduced.

The present invention is not limited to the above described embodiment and the variation but includes also various variations that could be conceived of by those skilled in the art, and the effects of the present invention are not limited to those described above, either. That is, the present invention is capable of various additions, changes, partial deletions and the like within a range not departing from conceptual idea and gist of the present invention derived from the contents prescribed in claims and equivalents thereof.

The invention claimed is:

1. A probe card in which an flexible printed circuit (FPC) board of a probe assembly is fixed to a main board side by a clamp mechanism, wherein
the clamp mechanism is composed of a fixing ring fixed to the main board side and on which the FPC board is mounted and a rotating ring screwed into the fixing ring and pressing a peripheral edge portion of the FPC board, and said probe card further comprises:
a pressing ring which is mounted in the fixing ring and is pressed by screwing of the rotating ring so as to press a peripheral edge portion of the FPC board to the main board side;
a fitting recess portion provided in an inner side of the fixing ring; and
a fitting projecting portion provided on an outer side of the pressing ring and allowing movement of the pressing ring in a direction of pressing the FPC board, the fitting projection portion suppressing rotation of the pressing ring through being fitted in the fitting recess portion.

2. The probe card according to claim 1, further comprising:
an elastic body ring as a buffer material mounted in the fixing ring and brought into contact with the FPC board.

3. The probe card according to claim 1, wherein
the fixing ring sandwiches and presses the peripheral edge portion of the FPC board together with the rotating ring.

4. The probe card according to claim 3, wherein
the rotating ring is formed integrally with the pressing ring.

5. The probe card according to claim 1, wherein
a handle for rotating the rotating ring is provided on an inner side of the rotating ring.

* * * * *